US 6,556,741 B1

(12) United States Patent
Fan

(10) Patent No.: US 6,556,741 B1
(45) Date of Patent: Apr. 29, 2003

(54) MEMS OPTICAL SWITCH WITH TORSIONAL HINGE AND METHOD OF FABRICATION THEREOF

(75) Inventor: Li Fan, San Diego, CA (US)

(73) Assignee: OMM, Inc., San Diego, CA (US)

( * ) Notice: Subject to any disclaimer, the term of this patent is extended or adjusted under 35 U.S.C. 154(b) by 15 days.

(21) Appl. No.: 09/697,762

(22) Filed: Oct. 25, 2000

(51) Int. Cl.⁷ .............................. G02B 6/26; G02B 7/182
(52) U.S. Cl. ..................................... 385/18; 359/874
(58) Field of Search ........................... 385/18; 359/872, 359/874

(56) References Cited

U.S. PATENT DOCUMENTS

| | | | |
|---|---|---|---|
| 4,317,611 A | 3/1982 | Petersen | 350/6.6 |
| 4,580,873 A | 4/1986 | Levinson | 350/96.2 |
| 4,662,746 A | 5/1987 | Hornbeck | 350/269 |
| 4,710,732 A | 12/1987 | Hornbeck | 332/7.51 |
| 4,956,619 A | 9/1990 | Hornbeck | 330/4.3 |
| 5,028,939 A | 7/1991 | Hornbeck et al. | 346/160 |
| 5,037,173 A | 8/1991 | Sampsell et al. | 385/17 |
| 5,096,279 A | 3/1992 | Hornbeck et al. | 359/230 |
| 5,172,262 A | 12/1992 | Hornbeck | 359/233 |
| 5,199,088 A | 3/1993 | Magel | 385/18 |
| 5,627,669 A | 5/1997 | Orino et al. | 359/156 |
| 5,646,928 A | 7/1997 | Wu et al. | 369/112 |
| 5,661,591 A | 8/1997 | Lin et al. | 359/290 |
| 5,774,604 A | 6/1998 | McDonald | 385/18 |
| 5,867,297 A | 2/1999 | Kiang et al. | 359/198 |
| 5,923,798 A | 7/1999 | Aksyuk et al. | 385/19 |
| 5,945,898 A | 8/1999 | Judy et al. | 335/78 |
| 5,960,132 A | 9/1999 | Lin | 385/18 |
| 6,024,801 A | 2/2000 | Wallace et al. | 134/1 |
| 6,034,807 A * | 3/2000 | Little et al. | 359/227 |

(List continued on next page.)

FOREIGN PATENT DOCUMENTS

| | | |
|---|---|---|
| EP | 0510629B A1 | 10/1992 |
| EP | 0689076 A1 | 12/1995 |
| EP | 0689077 A2 | 12/1995 |
| EP | 0690329B A2 | 1/1996 |
| EP | 0709911A A2 | 5/1996 |
| EP | 0711029 A2 | 5/1996 |
| EP | 0711029 A3 | 10/1996 |
| EP | 0746013A A2 | 12/1996 |
| EP | 0690329B A3 | 5/1997 |
| EP | 0510629B B1 | 7/1997 |
| EP | 0709911A A3 | 8/1997 |
| EP | 0880040A A2 | 11/1998 |
| EP | 0880040A A3 | 2/1999 |
| EP | 0902538A A2 | 3/1999 |
| EP | 0746013A A3 | 10/1999 |
| EP | 0902538A A3 | 12/1999 |

OTHER PUBLICATIONS

"MUMPs Design Handbook, Revision 4.0", Koester, et al., 1996.
"Process Tutorial", Sandia National Laboratories, Mar. 21, 1999.

Primary Examiner—Akm E. Ullah
Assistant Examiner—Jerry T Rahll
(74) Attorney, Agent, or Firm—Arien Ferrell; Aagaard & Balzan LLP

(57) ABSTRACT

In at least one embodiment, an apparatus having a first structure, a second structure, and a hinge coupled between the first and second structures. The hinge has a first flexible member aligned substantially along an axis. The hinge is arranged so that the second structure can rotate relative to the first structure substantially about the axis. The hinge can also include a second flexible member aligned substantially along the axis. The first and second flexible members being positioned on opposite sides of the second structure. In at least one embodiment, a method includes steps of fabrication of the apparatus.

31 Claims, 13 Drawing Sheets

U.S. PATENT DOCUMENTS

| | | | |
|---|---|---|---|
| 6,137,926 A | 10/2000 | Maynard | 385/18 |
| 6,144,781 A | 11/2000 | Goldstein et al. | 385/18 |
| 6,153,839 A | 11/2000 | Zavracky et al. | 200/181 |
| 6,166,478 A | 12/2000 | Yi et al. | 310/328 |
| 6,175,443 B1 | 1/2001 | Aksyuk et al. | 359/291 |
| 6,198,180 B1 | 3/2001 | Garcia | 310/36 |
| 6,198,565 B1 | 3/2001 | Iseki et al. | 359/224 |
| 6,201,629 B1 | 3/2001 | McClelland et al. | 359/223 |
| 6,215,921 B1 | 4/2001 | Lin | 385/18 |
| 6,230,567 B1 | 5/2001 | Grieff | 73/514.37 |
| 6,236,005 B1 | 5/2001 | Kvisteroey et al. | 200/61.45 |
| 6,243,507 B1 | 6/2001 | Goldstein et al. | 385/13 |
| 6,245,590 B1 | 6/2001 | Wine et al. | 438/52 |
| 6,246,504 B1 | 6/2001 | Hagelin et al. | 359/212 |
| 6,256,131 B1 | 7/2001 | Wine et al. | 359/199 |

\* cited by examiner

US 6,556,741 B1

MEMS OPTICAL SWITCH WITH TORSIONAL HINGE AND METHOD OF FABRICATION THEREOF

BACKGROUND

Microelectrical mechanical systems (MEMS) are electromechanical structures typically sized on a millimeter scale or smaller. These structures are used in a wide variety of applications including for example, sensing, electrical and optical switching, and micron scale (or smaller) machinery, such as robotics and motors. Because of their small size, MEMS devices may be fabricated utilizing semiconductor production methods and other microfabrication techniques such as thin film processing and photolithography. Once fabricated, the MEMS structures are assembled to form MEMS devices. The fabrication and assembly of MEMS devices is typically called "micromachining".

For optical switching, structures can be built which have a mirrored surface for reflecting a light beam from a sending input optical fiber to a separate receiving output fiber. By constructing a mirrored surface onto a movable structure, the mirror can be moved into, or out of, the path of a beam of light. With more than one switch aligned in the beam path, the beam can be directed to one of several receiving fibers. These types of structures are generally known as "optomechanical switches".

With optomechanical switches a common technique for moving mirrors and other structures is to employ one or more micromachined hinges. These hinges allow one structure to be rotated relative to another. With the use of a electrode, or other actuator, the movable structure attached to the hinge can be moved between two or more positions. For a structure with a movable mirror, the mirror is typically mounted out on an actuator arm which is hinged at its base. The mirror may use latches to fix it into a desired position.

With the actuator arm rotating about the hinge, the mirror can be moved into and out of a beam of light. As such, the hinge, by allowing the mirror to move between defined positions, enables the light beam to be switched between receiving devices such as various optical fibers, other mirrors, sensors and the like.

Another use for micromachined hinges is to facilitate the fabrication of MEMS structures. Hinges allow components built in common planes to one another, to be rotated to positions where the components are angled to one another. That is, by employing hinges, various non-planar structures can be created. The hinges also act to keep the base of the component in generally a fixed location while the component is rotated during construction. This results in a simpler construction process. An example of a construction hinge is a mirror set at a fixed angle to the actuator arm it is attached to. During the fabrication of this type of mirror, the mirror, actuator arm and latch are all etched out of aligned planar thin film layers. The mirror and the actuator arm are attached by a hinge. After the etching is complete, the mirror can be raised by placing a probe under the mirror and rotating it about the hinge until the latch is engaged and the mirror is locked into an upright or vertical position. After fabrication the mirror will not rotate about the hinge, but the hinge will continue to maintain the base of the mirror in a generally fixed position relative to the actuator arm.

Hinges can also be constructed both to enable construction of a structure and to allow rotational movement of the structure. One example of such a hinge use is with an actuator arm having a backflap which limits upward movement. The hinge is initially employed to allow the actuator arm to be raised and locked to the backflap at an angle relative to the backflap. Thereafter, the hinge operates to allow the actuator arm/backflap structure to rotate about the hinge. This results in a device that not only can move the actuator arm up and down, but limits the upward displacement of the arm.

In most cases, proper operation of MEMS devices are highly dependent on the specific positioning of the device's components. For example, with optomechanical switches, the positioning of the mirror must be within specific limits to allow the light beam to be properly switched. Improper mirror positioning can cause the reflected light beam to not sufficiently align with the receiving device (e.g. an output optical fiber), cause only a portion of the beam to contact the mirror, or even cause the beam to miss the mirror all together. Any of these events can easily result in the failure of the switch and effectively of the entire switching device (array of switches).

With hinges it is desirable to limit any non-hinge-aligned rotational movements as much as possible. That is, to keep the components of the device positioned correctly, translational movements of the device along and/or lateral to the hinge are sought to be minimized. The more the components can slide or slip about the hinge, the greater the potential for failure of the switch. Further, if the component can move both along and lateral to the hinge, then it will most probably be able to rotate in a direction not aligned with the hinge (e.g. in a yawing motion). Such rotational movements can also easily cause switch failure.

One type of prior hinge is shown in FIG. 1. This type of hinge is set forth in "Microfabricated hinges", by K. S. J. Pister, M. W. Judy, S. R. Burgett and R. S. Fearing, in Sensors and Actuators, Vol. 33, pp. 249–256, 1992, which is herein incorporated by reference in its entirety. Referring to FIG. 1, the switch 100 has an actuator arm 110 which rotates about a hinge 120. The hinge 120 includes a hinge axis 122 and a hinge opening 124, a clasp 126 having supports 128 and a bridge 130. In this hinge the axis 122 is position between the supports 128. When the actuator arm 110 is in its lowered position (as shown in FIG. 1), one support 128 extends up through the opening 124. Extending between each support 128 and over the axis 122 is the bridge 130. The supports 128 and bridge 130 define a duct 132 and enclose the axis 122. The axis 122 is free to rotate within the duct 132 as the actuator arm 110 is raised and lowered.

The hinge 120 has play in it which is partly a result of using a sacrificial layers to separate the elements during the fabrication process. The play is also a result of limits due to process resolution and design rules. The play is further necessary to provide enough space for the square shaped axis 122 to rotate within the duct 132.

Although undesired movements of the actuator arm 110 are limited to some extent by the hinge 120 structure, the amount of movement is typically still sufficient to allow misalignment of the actuator arm 110. That is, the play existing in the hinge 120 allows the actuator arm 110 to slide either, or both, along the axis 122 or laterally towards one of the supports 128. Also, with the axis 122 moving in the duct 132 the actuator arm 110 can pivot in a yawing manner. Any of these undesired movements can produce a failure of the switch 100 due to misalignment of the mirror (not shown) mounted on the actuator arm 110. Failure can also occur in such a switch as the contact between the axis 122 and the clasp 126 will cause premature wear and breakage.

Another hinge switch is shown in FIG. 2. With switch 200, the actuator arm 210 is attached by hinge 220. The hinge 220 includes an anchor 222 and couplings 224. Because the couplings 224 have a relatively thin and elongated structure (shaped in an extended arch), the couplings 224., are sufficiently deformable to allow the actuator to rotate about the hinge 220. The hinge 220 is etched from the same layer of material as the actuator arm 210 and the anchor 222 extends downward and connects to the surface 205 of the switch 200.

While the hinge 220 is simpler to construct than the hinge 120, it retains at least some of the unwanted play of the hinge 120. Specifically, in addition to allowing the actuator arm 210 to rotate, the couplings 224 also allow the actuator arm 210 to move in a lateral direction away from the anchor 222. That is, the couplings are flexible enough that the actuator arm 210 can be displaced outward from the hinge 220. In addition, the actuator arm 210 can move in other undesired directions including translationally along the length of the hinge 220 and can rotate about the hinge 220 in an yawing manner. As with the hinge 120, any of the possible undesired movements of the hinge 220 can result in failure of the switch 200.

Therefore, a need exists for a mircomachined hinge structure which eliminates or at least sufficiently minimizes all undesired movements about the hinge. Such a hinge structure must at the same time retain the ability of the hinge to allow the attached component to rotate freely in the desired direction. The hinge should further be capable of allowing repeated rotations of the attached component and/or to enable construction of the device by facilitating the rotation of one component relative to another and maintaining the position thereafter. The hinge should be capable of exerting a biasing force to urge the actuator arm to a desired position.

SUMMARY

In at least one embodiment, the apparatus is a thin film structure having a first structure, a second structure, and a hinge coupled between the first and second structures. Where the hinge has a first flexible member aligned substantially along an axis. The hinge is arranged so that the second structure can rotate relative to the first structure substantially about the axis.

In other embodiments, the hinge can also include a second flexible member aligned substantially along the axis. The first and second flexible members being positioned on opposite side of the second structure.

In some embodiments the apparatus is a MEMS optical switch having a substrate surface, an actuator arm with a mirror, and a hinge mounted between the substrate surface and the actuator arm. The hinge functions to allow the actuator arm to rotate relative to the substrate surface. The hinge has a first anchor, a second anchor, a first flexible member, a second flexible member, and a central section. The central section is mounted to the actuator arm. The first and second flexible members are connected to opposing sides of the central section substantially along an axis. The first anchor is mounted between the first flexible member and the substrate surface. Similarly, the second anchor is mounted between the second flexible member and the substrate surface.

In at least one embodiment, the method includes providing a first structure, forming over the first structure a sacrificial layer with a first via to the first structure, forming a hinge with a first anchor attached through the first via to the first structure and a first flexible member attached to the anchor, forming a deflectable structure attached to the hinge at the first flexible member, and removing the sacrificial layer so the deflectable structure may rotate about the hinge.

DETAILED DESCRIPTION OF PREFERRED EMBODIMENTS OF THE INVENTION

The present invention is embodied in a hinge apparatus and a method of fabricating the same. In one embodiment, the invention includes a hinge with elongated flexible members connected between anchor members and the structure which rotates about the hinge.

An advantage of embodiments of the present invention is that while allowing the attached structure to freely rotate about the axis of the hinge, the hinge also substantially prevents any additional undesired movement of the attached structure about the hinge. That is, the hinge greatly minimizes translational and non-axial rotational movements of the attached structure.

Another advantage is that the present invention can be used not only to rotationally mount a component, but also in assembly of a device. This is done by allowing one structure to be rotated relative to a another structure and then secured by a latching mechanism. After operating to allow rotation during assembly, the hinge then operates to keep the two structures secured in fixed positions to one another. The present invention can also be configured to allow both construction and rotation of any particular component of a device.

Still another advantage of the present invention is that it is easy to construct and is not subject to premature wear and/or failure.

The advantages of the present invention provides a device with more precisely positioned components which will maintain their desired positioning without any significant deviations. This in turn provides devices with dramatically reduced potential for failure due to component misalignment and increases the operational life spans of the devices. This also provides the advantage of increased production yield. When used in devices such as optomechanical switches, the present invention, by allowing the mirror component to be positioned with greater accuracy, reduces failures caused by improper positioning and/or alignment of the mirror.

Figure 1:
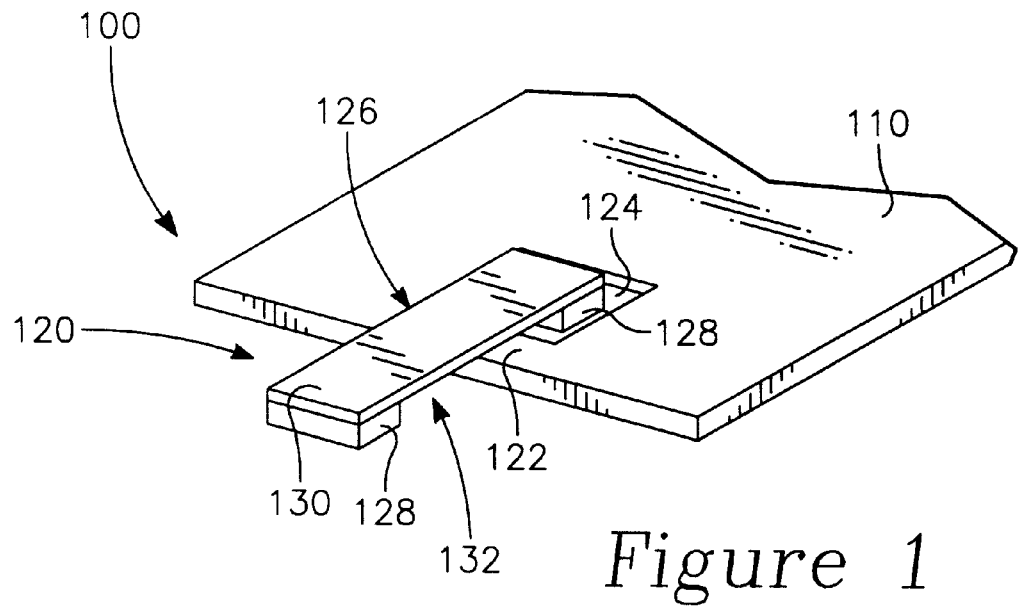
FIG. 1 is an isometric view of a hinge structure.
Figure 2:
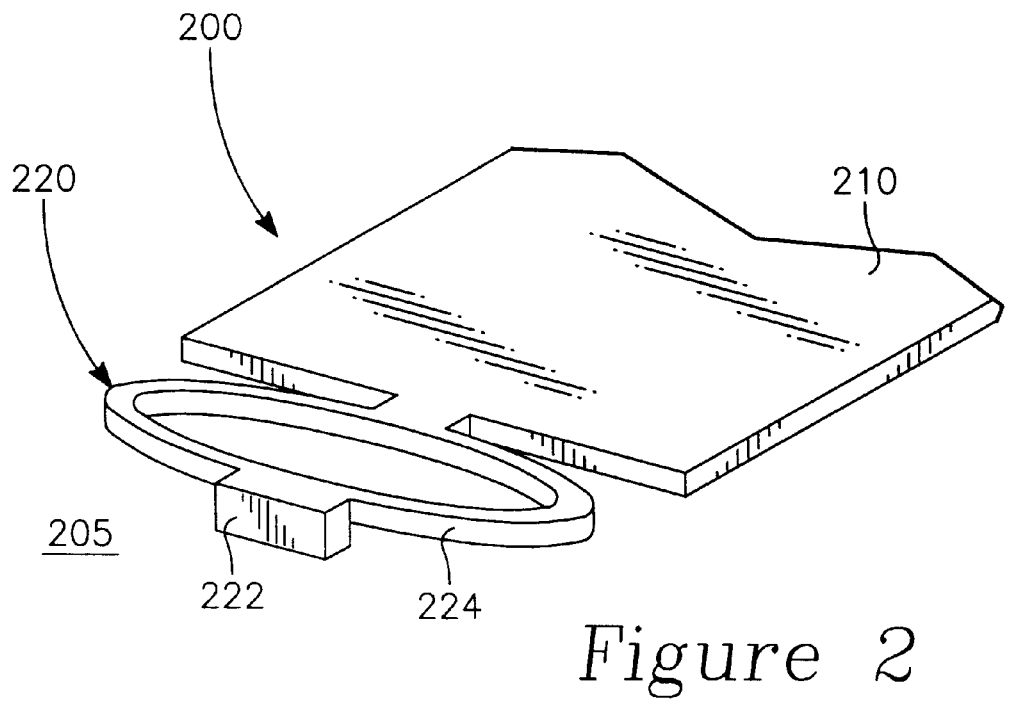
FIG. 2 is an isometric view of a hinge structure.
Figure 3A:
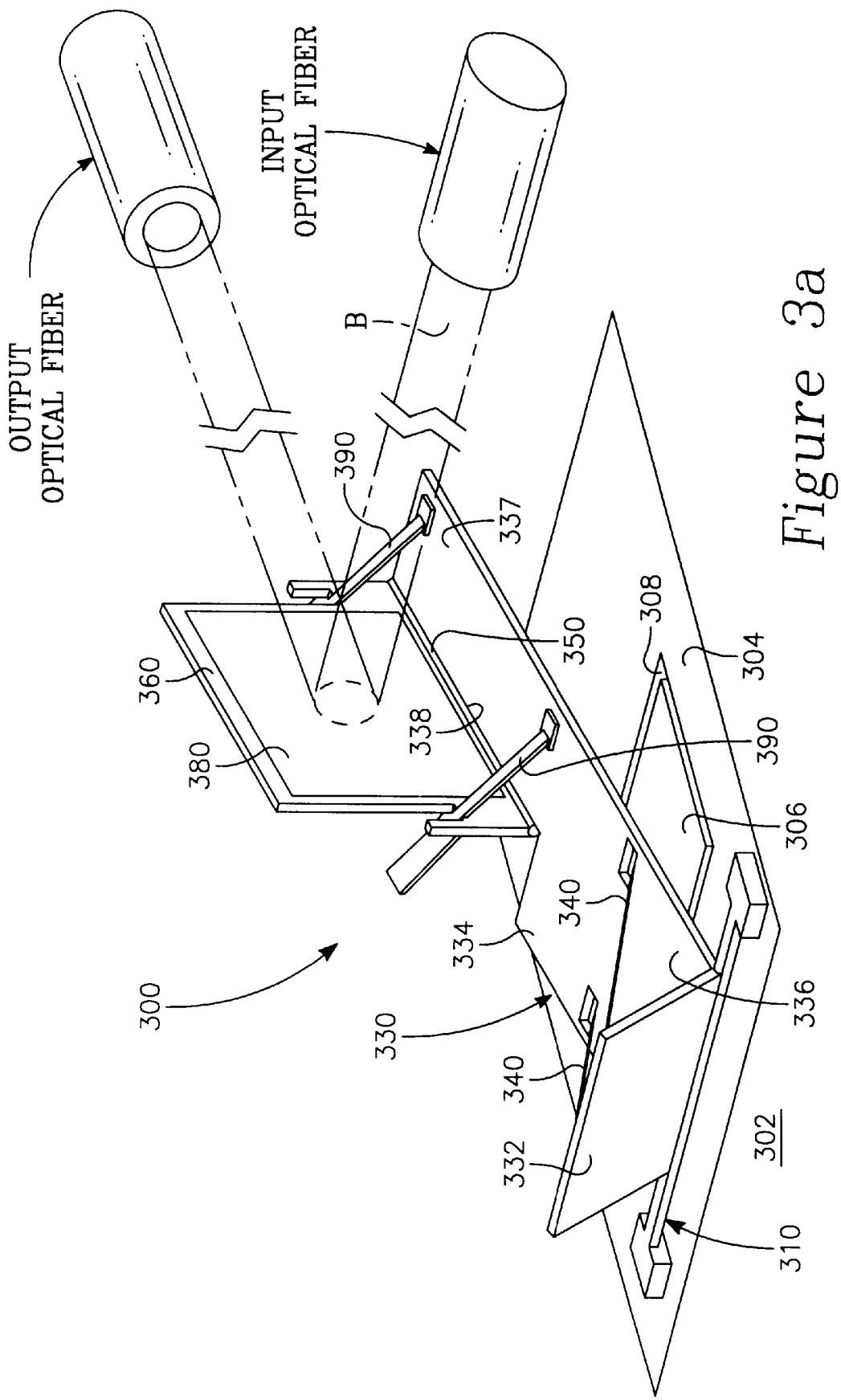
FIGS. 3a and b are an isometric views of an optical switch including a hinge in accordance with an embodiment of the present invention.
Figure 3B:
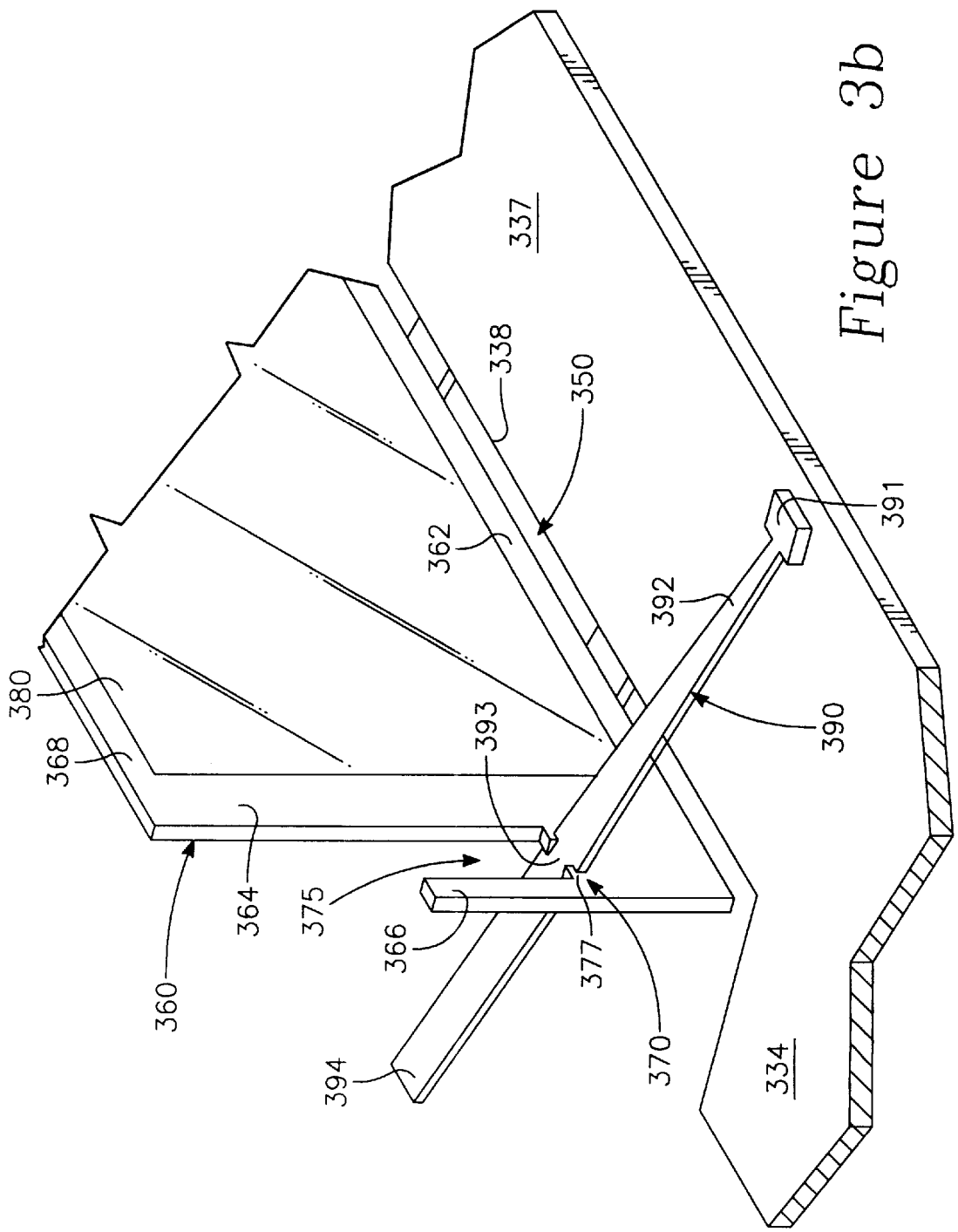
Figure 4:
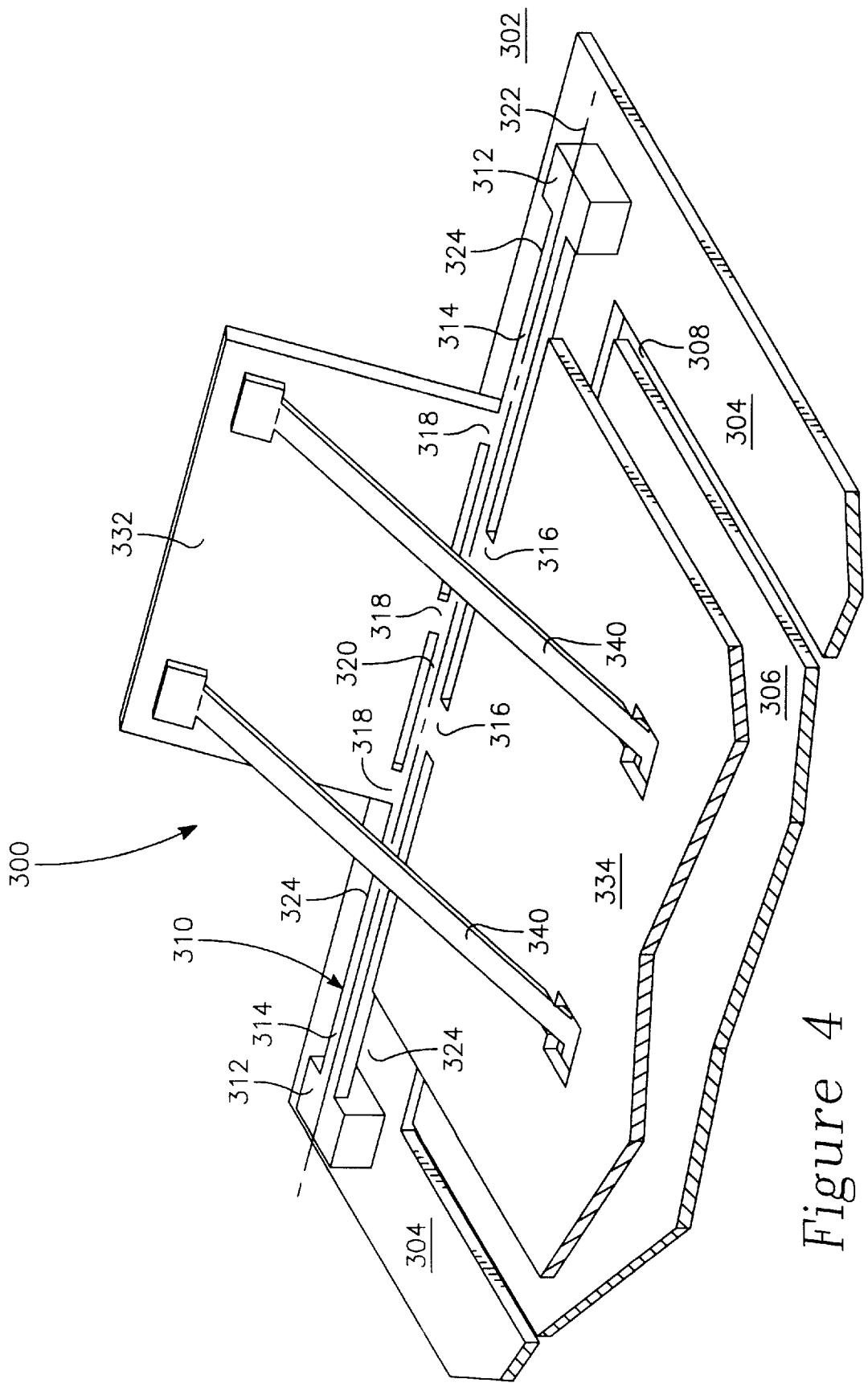
FIG. 4 is an isometric view of a portion of an optical switch structure including a hinge in accordance with an embodiment of the present invention.

Some Embodiments of the Apparatus of the Invention:

The apparatus of the invention can have any of a variety of embodiments. In one embodiment, as shown in FIGS. 3–4, the apparatus of the invention is a torsional hinge spring or hinge 310. As shown in FIG. 3a, the hinge 310 is set in a switch 300, which also includes an actuator arm 330, an actuator latch 340, a mirror hinge 350, a mirror structure 360, catches 370, a mirror 380, and mirror latches 390. The switch 300 is mounted on a surface 302.

An example of an actuator is set forth in U.S. patent application No. 09,697,037, entitled MEMS OPTICAL SWITCH WITH SHIELD PROVIDING REDUCED LIKELIHOOD OF SHORTING AND METHOD OF FABRICATION THEREOF, by Li Fan, filed on Oct. 10, 2000, which is hereby incorporated by reference in its entirety. An example of a latch is disclosed in U.S. patent application No. 09,697,038, by Li Fan, filed on Oct. 25, 2000, entitled MEMS OPTICAL SWITCH WITH A NOTCHED LATCHING APPARATUS FOR IMPROVED MIRROR POSITIONING AND METHOD OF FABRICATION THEREOF, which is herein incorporated by reference in its entirety. An example of a stopper is set forth in. U.S. patent application No. 09,697,767, entitled MEMS MICROSTRUCTURE POSITIONER AND METHOD OF FABRICATION THEREOF, by Li Fan, filed on Oct. 25, 2000, which is hereby incorporated by reference in its entirety.

As described in detail herein, preferably most of the components of the switch 300 can be constructed of polycrystalline silicon deposited in several layers, such as a poly 0 layer 420, a poly 1 layer 440 and a poly 2 layer 460. These layers being separated by sacrificial layers such as a lower oxide layer 430 and a middle oxide layer 450. These poly layers and oxide layers are shown in detail in FIGS. 7 and 8, and described in detail herein.

Returning to FIGS. 3–4, the switch 300 can be moved about the main hinge 310 from a raised position, to a lowered position (shown by the solid lines in FIG. 3a). The switch 300 can be configured either that the mirror 380 is in the path of the beam of light B when the switch 300 is in its lowered position or when its in its raised position. In either case, when the switch 300 is moved to the other position, the mirror 380 will be out of the beam of light B. It is preferred that the mirror is in the path of light when the switch is in its lowered position. In this manner, the light beam B can be switched from either continuing straight past the switch 300 or being reflected at a predefined angle. After passing the switch 300, the beam of light, whether reflected or not, can continue on to receiving device such as another switch, a receiving optical fiber, a sensor, or other similar element.

The switch 300 may be made of a poly silicon material. Alternative materials can be any thin film material including conductive and non-conductive materials, single crystal silicon and oxide materials. However, poly silicon generally provides greater strength, as well as flatter and more uniform structures, than the other usable materials.

The switch 300 moves between its lowered and raised positions by actuating the actuator arm 330 about the hinge 310. As seen in FIG. 3a, the actuator arm 330 includes a backflap 332 and a main arm portion 334. The main arm portion 334 has an end 336 proximate to the hinge 310, a end 337 distal from the hinge and an edge 338 positioned near the distal end 337. The mirror structure 360 is mounted at the outboard end 337 of the main arm 334. The main arm 334 is attached to the backflap 332 by the hinge 310 and the actuator latches 340. The hinge 310 is mounted to the surface 302. The backflap 332 and the main arm 334 are set at a fixed angle to each other.

Figure 7A:
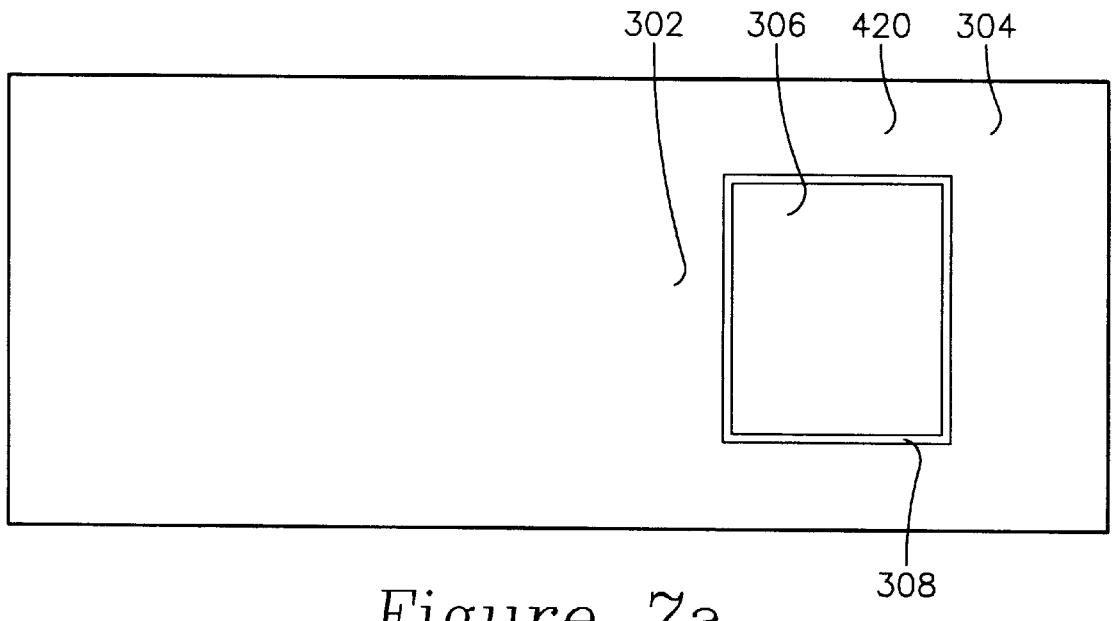
FIGS. 7a–f are top views of layers of material in accordance with an embodiment of the present invention.
Figure 7B:
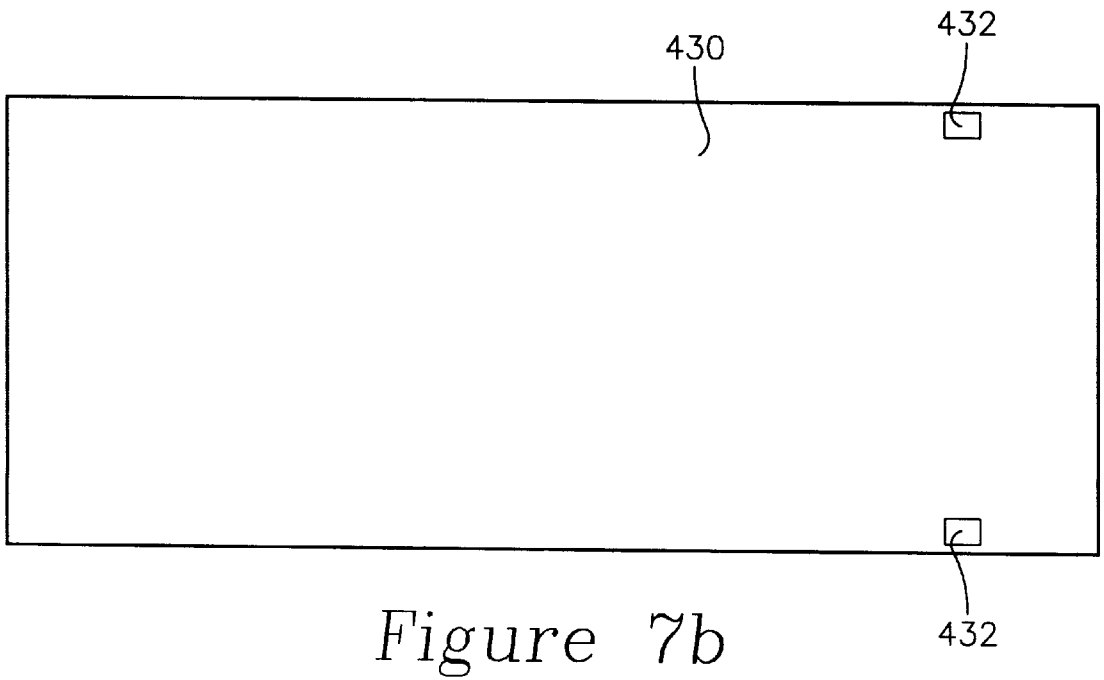
Figure 7C:
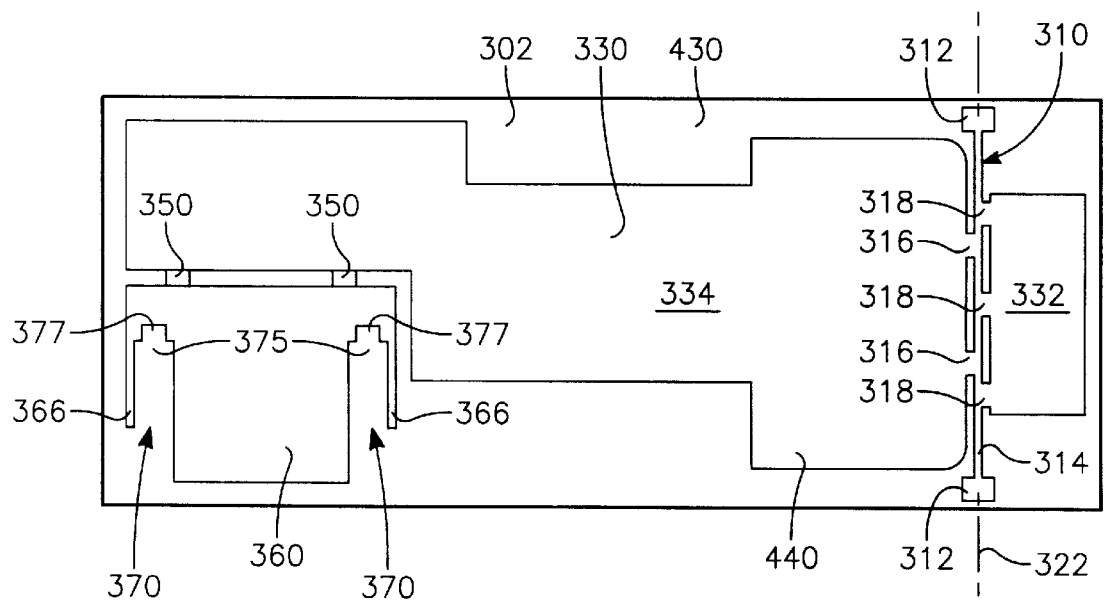

The actuator arm 330 must be at least thick enough to have sufficient structural support to carry the mirror 380, and operate without excessive deflection or failure. The exact thickness of the actuator arm 330 will vary depending on the specifics of the use and the properties of the material used. The actuator arm 330 should be made of a conductive material so that a charge can be applied to actuate the arm 330. In one embodiment, the actuator arm 330 is a doped polycrystalline silicon having a substantially uniform thickness of about a few microns. The main arm 334 typically has a length of about one millimeter from the end of the backflap 332 to the opposing end of the main arm 334. The actuator arm 330 is constructed from the poly 1 layer 440, as shown in FIG. 7c, as discussed below.

The actuator arm hinge 310 is mounted between the actuator arm 330 and the surface 302, as shown in FIGS. 3a and 4. The hinge 310 functions to allow the actuator arm 330 to rotate freely relative to the surface 302. Depending on the use, the hinge 310 can be configured to provide a biasing force onto the arm 330 to urge the arm 330 to a desired position, for example, toward or away from the surface 302. The hinge 310 is built from the poly 1 layer 440 and is connected to the poly 0 layer 420, shown in FIG. 7c, discussed below.

The hinge 310 can be any of a variety of configurations. In some embodiments of the present invention, as shown in FIG. 4, the hinge 310 includes anchor points 312, flexible or elastic members 314, main arm connectors 316, backflap connectors 318 and a central section 320.

The anchor points 312 are positioned on either side of the hinge 310 and extend downward to, and connect with, the surface of the structure which the hinge 310 is mounted on. As shown in FIG. 4, each anchor point 312 is mounted on the surface 302. The anchor points 312 function to anchor the hinge 310 in place. To provide sufficient contact area of the hinge 310 to the surface 302 it is preferred that the anchor points 312 are wider than the rest of the hinge 310 structure. The anchor points 312 should be large enough to carry and transfer loads applied onto the hinge 310 and the actuator arm 330 to the surface 302, without overly deforming or failing. The specific size of the anchor points 312 can vary depending on the requirements of the specific use of the switch 300.

The anchor points 312 connect to the surface 302 on the shield 304. This allows a charge applied to the shield 304 to be transferred to the actuator arm 330 by the hinge 310. In this manner the actuator arm 330 can have applied a different charge from that of the actuator pad 306. This allows the actuator arm 330 to be moved towards or away from the actuator pad 306, depending on the charge placed on each. To allow the charge to be transferred through the hinge 310, it is preferred that the hinge 310 is made of a conductive material.

The flexible members 314 are connected to the anchor points 312 and run inward towards the central section 320. The flexible members 314 are shown in FIG. 4. The flexible members 314 function to allow the central section 320 to rotate about an axis 322, which is generally aligned along the length of the hinge 310. The flexible members 314 allow this rotation by being deformable along their length. That is, as the actuator arm 330 is lifted, the central section 320 will rotate and the flexible members 314 are in turn twisted between the central section 320 and each of the anchor points 312.

The width, thickness and length of the flexible members 314 can vary, depending on the specific requirements of the use. The flexible members 314 must be at least wide and thick enough to carry the loads between the actuator arm 330 and the anchor points 312, but must be small enough to allow sufficient deflection without premature failure of the hinge 310. The specific material properties of the material will also affect the dimensions of the flexible members 314. Since the hinge 310 is preferably etched from the poly 1 layer 440 (not shown), the flexible members 314 will be a doped polycrystalline silicon having a thickness of about 1.0 $\mu$m.

Depending on the dimensions and material properties, the flexible members 314 can each exert a restoring or biasing force on the actuator arm 330 to urge it a desired direction. For example, the flexible members 314 can be configured to bias the main arm 334 toward the surface 302.

As can be seen in FIGS. 3 and 4, the flexible members 314 also function to prevent the actuator arm 330 from being able to be displaced from side-to-side (along the axis 322) or in a direction lateral to the axis 322. That is, the configuration of the hinge 310 with the flexible members 314, does not allow any movement (e.g. play) in directions other than rotation about the axis 322. This in turn provides the significant advantage that the components of the deflectable structure attached to the hinge 310 are kept positioned with greater accuracy. For the switch 300 this means that the mirror 380 will be kept in substantially the same position every time it is positioned in the light beam B. Increased positioning accuracy will increase production yields and lower failure rates.

As shown in FIG. 4, the main arm 334 is attached to the hinge 310 at the main arm connector 316. In the embodiment shown, the main arm connector 316 is two tabs equally placed from the center of the hinge 310. However, the configuration of the main arm connector 316 can vary. For example, one or several tabs can be used, or the main arm 334 can simply be attached directly to the central section 320 without any tabs in between. It is preferred that the tabs are used to allow the main arm 334 to be rotated relative to the central section 320 (and the backflap 332), during construction of the actuator arm 330. That is, during fabrication when the main arm 334 is raised (e.g. by a probe), while the backflap 332 is positioned on the surface 302, the main arm connector 318 will bend (being the narrowest structure) to allow the main arm 334 to be angled relative to the central section 320. This allows the main arm 334 to be raised enough to engage the actuator latch 340 in the main arm 334.

Like the main arm connectors 316, the backflap connectors 318 function to connect the backflap 332 to the central section 320 and allow the backflap 332 to rotate relative to the central section 320 during fabrication of the switch 300. The backflap connectors 318 can be of any configuration including one or more tabs, or as a direct connection between the backflap 332 and the central section 320. One embodiment is shown in FIG. 4 wherein the backflap connector is three tabs (one in the center and two on either side).

The central section 320 is positioned between the two flexible members 314 and simply functions to connect the back flap 332 and the main arm 334 to each other and to the flexible members 314. As shown in FIG. 4, the central section 320 is an elongated beam running along the axis 322 of the hinge 310. It is possible in some embodiments that the central section 320 can be coupled to the backflap 332 and the main arm 334 with a continuous portion rather than with tabs 316 and 318 as shown in FIG. 4.

In some embodiments, the central section 320 can extend down and connect to the surface 302.

As seen in FIG. 4, the flexible members 314, main arm connector 316, backflap connector 318 and central section 320 are all positioned above and separate from the surface 302 by an opening 324. The opening 324 allows these components to move (e.g. rotate about the axis 322) without contacting the surface 302. It is preferred that the opening 324 is about 2.0 $\mu$m (e.g. defined by the size of the sacrificial layer which defined the opening).

Figure 5:
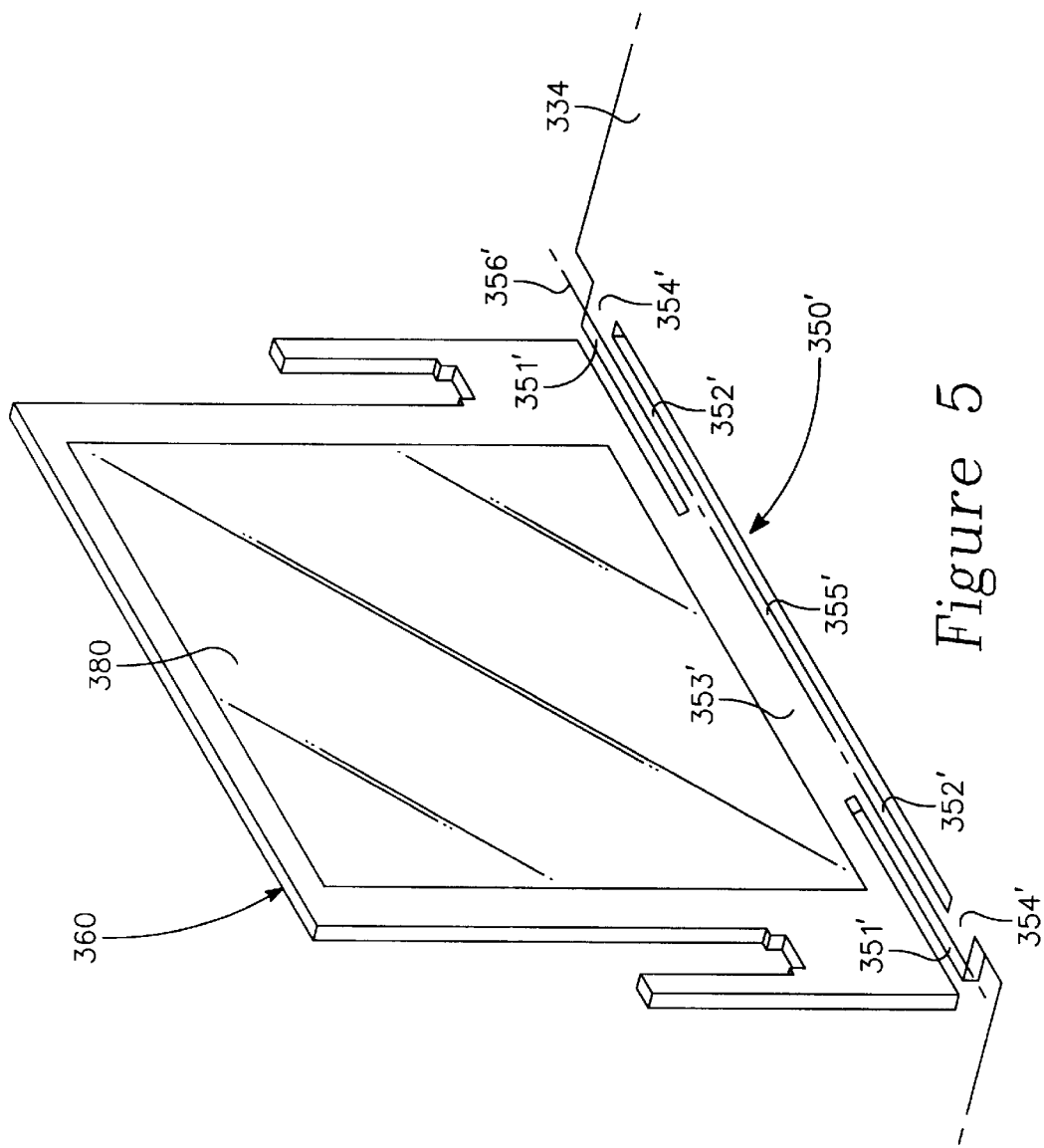
FIG. 5 is an isometric view of a hinge in accordance with an embodiment of the present invention, a mirror structure and a portion of an actuator arm structure.

Although the hinge 310 is shown in FIGS. 3 and 4 attached to the backflap 332 and the main arm 334, the hinge 310 can be used to attach any deflectable structure. For example, as detailed herein, the mirror structure 360 can be attached to the actuator arm 330 by a hinge 350' in accordance with the present invention, as shown in FIG. 5. Similarly, the present invention can be used to connect latches 390 at their bases, this is also detailed herein and in FIG. 6.

As shown in FIG. 3a, the surface 302 can include a shield 304 and an electrode or actuator 306. The shield 304 is typically positioned near or about the actuator 306 and is connected to the actuator arm hinge 310. The actuator 306 is typically shaped as a pad positioned directly beneath the actuator arm 330. Opposite charges can be placed on the actuator 306 and through the shield 304 to the actuator arm 330. This allows the actuator 306 and actuator arm 330 to be charged to be attracted each other. Then the actuator arm 330 is moved to its lowered position, causing the mirror 380 to slide vertically into the path of the light beam B. This allows the mirror 380 to reflect the light beam B while the mirror 380 is kept, throughout its movement, at a substantially constant angle relative to the light beam B. This constant angle provides increased accuracy of the pointing of the reflected light beam, since the mirror 380 is not subject to the positioning errors found in devices which move the mirror by changing its angle to the light beam (e.g. pop-up or flip-up mirrors). In addition, since the hinge 310 strictly limits any undesired movements of the actuator arm 330, the mirror 380 will not deviate from the allowable positioning tolerances as is common with prior hinge designs.

With no charges applied to the actuator arm 330 and the actuator 306, the biasing force of the flexile members 314 causes the arm 330 to move away from the actuator 304, raising the mirror 380 out of the beam of light B.

The surface 302 can be constructed of any suitable well known thin film material including polycrystalline silicon or oxide materials. In some embodiments, a doped polycrystalline silicon is used. Further, the surface 302 may be constructed on the poly 0 layer 420 of the device, as shown in FIG. 7a.

Turning back to FIGS. 3a and 4, to allow the switch 300 to be operated properly, the shield 304 and the actuator 306 should be configured to be electrically isolated from one another. Preferably, this is accomplished by etching a trench between the shield 304 and the actuator 306, such that an air gap 308 exists to insulate the elements from one another.

As shown in FIGS. 3a and b, near the distal end 337 of the main arm 334, is mounted the mirror hinge 350. The mirror hinge 350 is positioned between the main arm 334 and the mirror structure 360. In this embodiment, the hinge 350 is positioned adjacent the edge 338 of the arm 334. The hinge 350 allows the mirror structure 360 to be rotated from a substantially horizontal position, to a generally vertical position, during fabrication of the switch 300. After the switch 300 is fabricated, preferably the mirror structure 360 will not further move about the hinge 350. That is, after fabrication of the switch 300, the hinge 350 merely acts to keep the mirror base 362 of the mirror structure 360 connected to and in a constant position relative to, the main arm 334.

Like the arm 330, the mirror hinge 350 may be constructed in the poly 1 layer 440 and is of a polycrystalline silicon material. The mirror hinge 350 can be of any of a variety of configurations. so long as is sized to allow it to be deformed as the mirror structure 360 is raised and thereafter maintain the mirror structure 360 in a constant position attached to the actuator arm 330.

In one embodiment of the present invention, the mirror hinge 350' is configured as shown in FIG. 5. In this embodiment, the mirror hinge 350' is in accordance with the present invention. The mirror hinge 350' includes mirror hinge anchor 351', mirror hinge flexible members 352', mirror connector 353', mirror hinge main arm connector 354' and a mirror hinge central section 355'. The mirror hinge anchor 351' is two tabs mounted to the main arm 334. The mirror hinge flexible members 352', are two elongated members which can be deflected about an mirror hinge axis 356', which runs along the length of the mirror hinge 350'. The members 352', by their deflection about the axis 356' produce a biasing force on the mirror structure 360 which forces the mirror structure 360 onto the latches 390 to keep the mirror structure 360 in place. The mirror connector 353' is an elongated tab connecting the mirror structure 360 to the mirror hinge central section 355'. The mirror hinge main arm connector 354' is a set of tabs connecting the main arm 334 to the mirror hinge central section 355'. The mirror hinge central section 355' is an elongated section along the axis 356'. By not allowing the mirror structure 360 to move along, or lateral to, the axis 356', the mirror hinge 350' increases the accuracy of the positioning of the mirror 380. As with the actuator hinge 350, the components of the mirror hinge 350' can vary in their configurations.

As shown in FIGS. 3a and b, the mirror structure 360 is attached to the actuator arm 330 at the mirror base 362 by the mirror hinge 350, and at its sides 364 by the latches 390. The mirror structure 360 is held in a fixed position and angle relative to the actuator arm 330, and thus at a fixed angle relative to the light beam B. Although the mirror 380 can be set at any of a variety of fixed angles, it is preferred that the mirror 380 be set at substantially 90 degrees to the actuator arm 330.

The mirror structure 360 also functions to provide a sufficiently smooth surface for the mirror 380, which is mounted over a flat front surface 368 of the mirror structure 360. Although it can be any of a variety of sizes, the mirror structure 360 must be at least large enough to support a mirror which is sized to reflect a light beam of a given size. In some embodiments, the mirror structure 360 is about 300 $\mu$m tall and 400 $\mu$m wide. The mirror structure 360 must further be sufficiently thick to support the mirror 380 and provide sufficient rigidity to prevent excessive deformation of the mirror 380. The mirror structure 360, being made from the poly 1 layer 440, may be a polycrystalline silicon with a thickness of about 1.0 $\mu$m.

As shown in FIGS. 3a and b, over the front surface 368 of the mirror structure 360 is the mirror 380. The mirror 380 can be of any well known sufficiently reflective material for a desired transmission frequency, such as aluminum, copper, silver or gold. However, in one embodiment the mirror 380 is made of gold to reflect infrared frequencies. Gold provides the advantage that it is compatible with HF chemical releasing. The mirror 380 can be of any size and shape so long as it fits onto the mirror structure 360 and is large enough to reflect all, or at least a sufficient amount, of the light beam B. Preferably, the mirror is large enough to reflect all of the light beam. In at least one embodiment of the apparatus, the mirror is about 300 $\mu$m tall and about 400 $\mu$m wide.

At the sides 364 of the mirror structure 360 are guides 366 and catches 370. The guides 366 are used to guide the latches 390, into position when the mirror structure is raised to its upright position during fabrication. The guides 366 are elongated narrow beams which extend from the catches 370 out along a path generally defined by the desired movement of the latch 390 as the switch 300 is constructed. The guides 366 can vary in width, length and thickness. However, the guides 366 must be wide enough to support loads generated if the latches 390 attempt to slide off the catches 370. Also, the guides 366 must be long enough to retain the latches 390 behind the guides 366 when the mirror structure 360 is raised underneath the latches 390. To simplify fabrication, the guides 366 are preferably the same thickness as the rest of the mirror structure 360, that is about 1.0 $\mu$m. The actual shape the guides 366 can vary but it is preferred that the inside edge is kept generally straight to facilitate movement of the latches 390 along the guides 366.

As the mirror structure 360 is raised up from a horizontal position to an upright or vertical position, the catches 370, which are initially positioned underneath the latches 390 when the mirror structure 360 is in the horizontal position, move up to contact the latches 390. With the catches 370 contacting the latches 390, the guides 366 extend from the catches 370 out past and over the latches 390. This causes the guides 366 to direct the latches 390 into along the catches 370. Having a latch 390 slide off a catch 370 could result in a failure of device as the mirror 380 most probably would not be positioned properly.

Therefore, as the mirror structure 360 is raised into position, the guides 366 each operate to maintain the latches 390 positioned over their respective catches 370 until the latches 390 engage each catch 370 and the mirror structure 360 is locked into its upright position.

As shown in FIGS. 3a and b, each latch 390 includes an anchor 391, an inboard portion 392, a central portion 393, an outboard portion 394.

Each side 364 of the mirror structure 360 has a catch 370, as set forth in FIGS. 3a and b. The catches 370 function to receive central portions 393 of the mirror latches 390. Each catch 370 includes an upper trench 375 and lower trench 377.

As the mirror structure 360 is raised to complete fabrication, the outboard portion 394 of the latch 390 is received into the upper trench 375. Then, the outboard portion 394 slides in the upper trench 375 as the mirror structure 360 is raised up to its upright position. As the central portion 393 of the latch 390 reaches the catch 370, the central portion 393 drops into the lower trench 377. In this position, the latch 390 is held in position in the catch 370, as shown in FIG. 3b.

The latches 390 can be made of any suitable thin film material, including polycrystalline silicon and oxide. However, polycrystalline silicon at an uniform thickness of about 1.5 $\mu$m is preferred. Also, preferably the latches 390 are constructed from the poly 2 layer 460 (not shown). Although the material used for the latches 390 does not have to be electrically conductive, to avoid retaining a charge in switch 300, it is preferred that the material used is conductive. Retaining a charge in the switch 300 is preferably avoided, since a retained charge could prevent the switch from actuating.

As noted, during fabrication the mirror structure 360 is raised from its initial flat position up to a fixed upright position. The latches 390 are fabricated initially flat, being connected at their anchor 391 to the actuator arm 330 and extending out over the catches 370.

The outboard portion 394 then drops behind the lower trench 377 when the central portion 393 drops into the lower trench 377.

The size, length and shape of the outboard portion 394 can vary depending on the specifics of the design. It is preferred that the outboard portion 394 is long enough so that it is received in the upper trench 375 as the mirror structure 360 is brought up to first contact the latch 390.

As previously noted, the latch 390 is kept over the catch 370 by the guide 366, as the mirror structure 360 is raised. As such, to allow the latch 390 to be locked into the catch 370, the positioning and size of the outboard portion 394 relative to the central portion 393 must be such that the central portion 393 will be received into the lower trench 377 regardless of the position of the outboard portion 394 in the upper trench 375.

Figure 6:
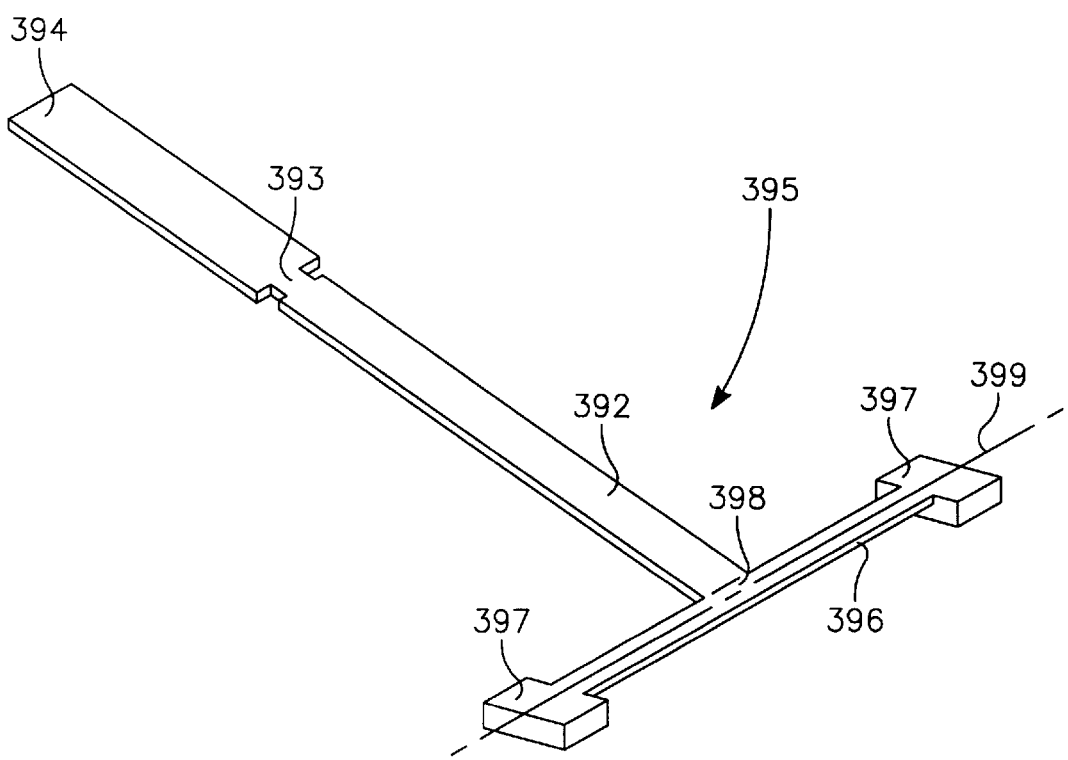
FIG. 6 is an isometric view of a latch in accordance with an embodiment of the present invention.

In one embodiment, the latch 390 can include a hinge in accordance with the present invention. This embodiment is shown in FIG. 6. As shown, the latch 390 can include a latch hinge 395 which is positioned between an anchor 397 and the inboard portion 392. The latch hinge 395 includes a latch flexible member 396 and a latch hinge central section 398.

The operation and configuration of the latch hinge 395 is very similar to that of the actuator hinge 310. The latch hinge 395 functions to allow the latch structure to rotate about an axis 399. This is accomplished by the latch flexible member 396 being deformed about an axis 399. The deformation of the member 396 results in a restoring or biasing force being exerted on the latch structure. As such, the latch hinge 395 causes the latch 390 to be held against the catch 370 (not shown) as the mirror structure 360 (not shown) is raised during fabrication. Further, the latch hinge 395 urges the latch 390 into engagement with the catch 370 (not shown), locking the mirror structure 360 (not shown) in its upright position.

In another embodiment of the invention, a hinge with substantially the same configuration can be used with the actuator latch 340. In this embodiment, the actuator latch 340 can be rotated with a biasing force to allow the latch 340 to lock into the main arm 334. This allows the main arm 334 to be secured in a position angled to the backflap 332.

Alternate embodiments of the present invention include use in other MEMS structures. For example, any MEMS structure which requires positioning at least two surfaces at angles to one another, the present invention can be used. The present invention is especially useful for precision positioning of a set, or a production run, of structures with minimum deviations.

One other alternate embodiment of the switch, has the structural layers (e.g. poly 0, poly 1 and poly 2) made of an oxide material (e.g. tetraethylorthosilicate or TEOS), in place of the polycrystalline silicon as used in the embodiments described above. The structural shape and positioning of elements in this alternate embodiment otherwise remains the same as describe above.

Some Embodiments of the Method of the Invention:

The method of the present invention is embodied in a method for fabricating a micromachined hinge. The method provides a straight forward and reliable means of fabricating a torsion hinge for joining structures in a micromachined device. The hinge produced by this method limits the movements of the structure attached to the hinge to only rotational movements about the hinge. That is, the hinge prevents undesired movements such as translational movements along or lateral to the hinge axis and other rotational movement such as yawing. This displacement limitation increases the accuracy of the positioning of the components of the device. This, in turn, can provide increased operation life of the device and increased production yield. For use in the fabrication of optomechanical switches, the positioning accuracy provided by the hinge reduces the potential for switch failure caused by misalignment and/or improper positioning of the mirror.

In one embodiment, the steps of the method 500 of fabricating the hinge 310 include providing a first structure 510, forming over the first structure a sacrificial layer with a via to the first structure 520, forming a hinge with an anchor attached through the via to the first structure and a first flexible member attached to the anchor 530, forming a deflectable structure attached to the hinge at the first flexible member 540, removing the sacrificial layer so that the deflectable structure may rotate about the hinge 550.

Figure 9:
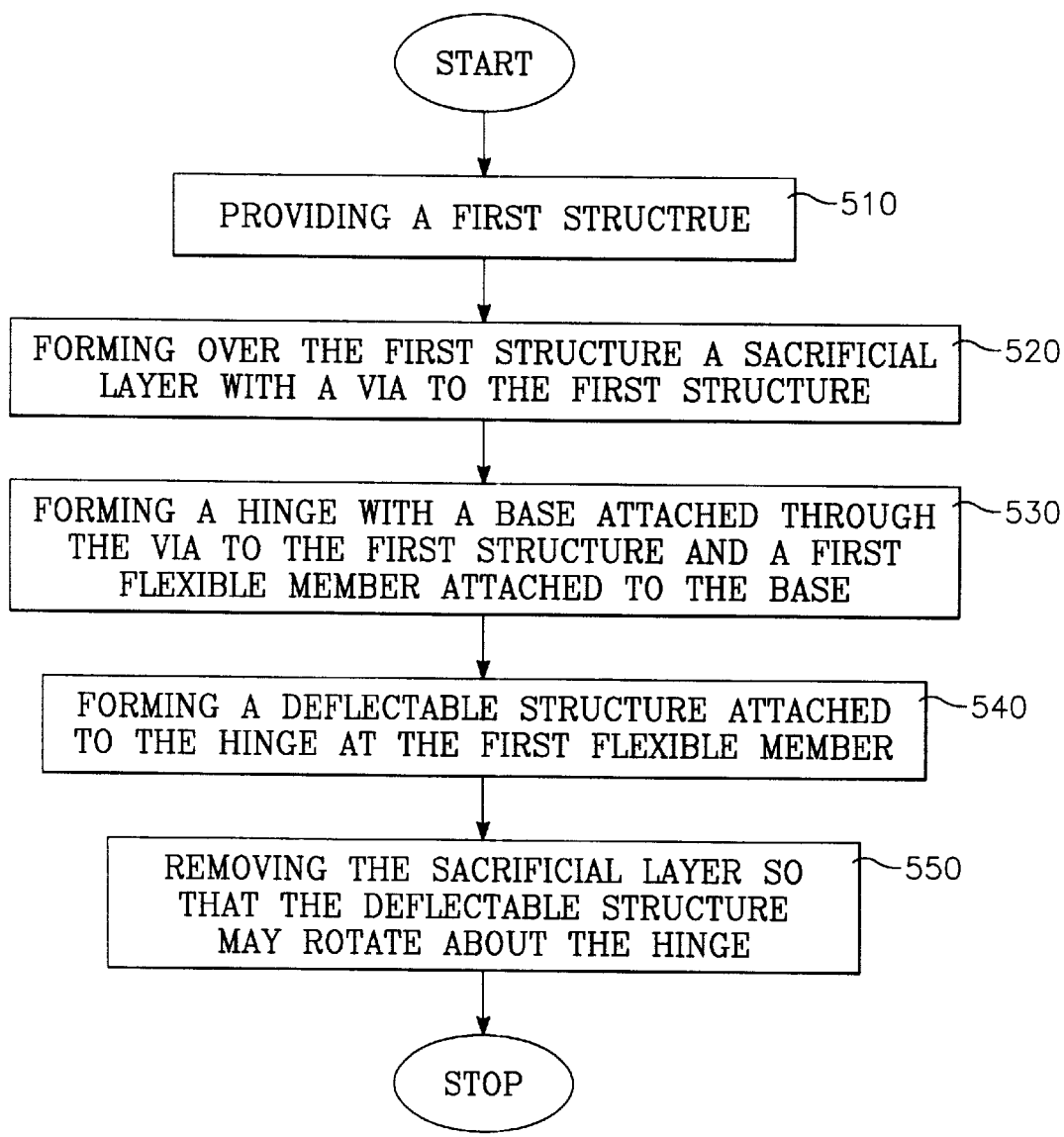
FIG. 9 is a chart of a method in accordance with an embodiment of the present invention.

First, a base strucutre is created in the step of providing a first structure 510. This step is shown in FIGS. 7a and 9. In some embodiments the first structure created is the surface 302 which is from the poly 0 layer 420. The poly 0 layer 420 can be deposited by any method well known in the art. The poly 0 layer 420 is preferably a doped polycrystalline silicon (Si) 0.5 $\mu$m thick. Further, it is preferred that the surface 302 includes the shield 304 and the actuator 306.

In some embodiments the step of providing a first structure 510 further includes the steps of providing a substrate 512, forming an insulation layer 514, forming a poly 0 layer 516 and etching the poly 0 layer 518 are performed.

Figure 10A:
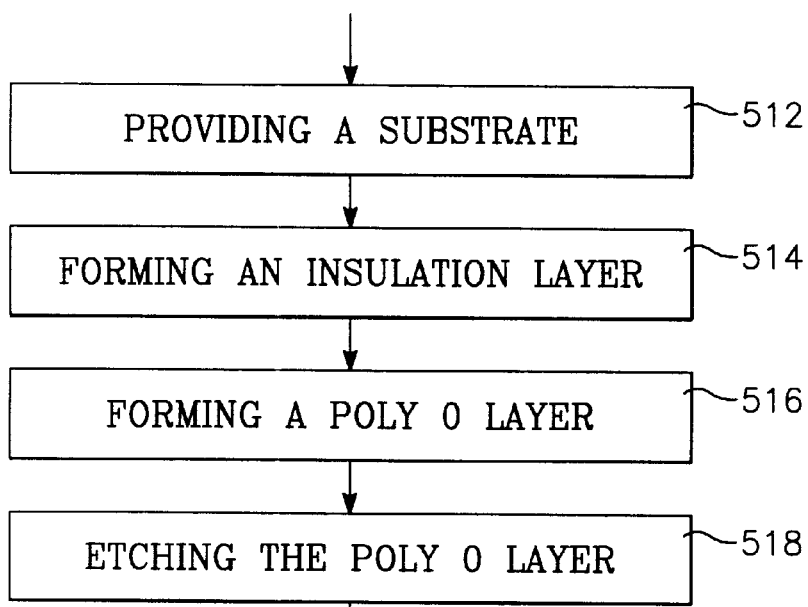
FIGS. 10a–e are charts of methods in accordance with embodiments of the present invention.

The step of providing a substrate 512 is shown in FIG. 10a. Preferably, the substrate 410 is a layer of single-crystal silicon 675 $\mu$m thick. The substrate 410 functions to provide a structural base for the switch 300. The substrate 410 can be deposited by any well known method.

Figure 8:
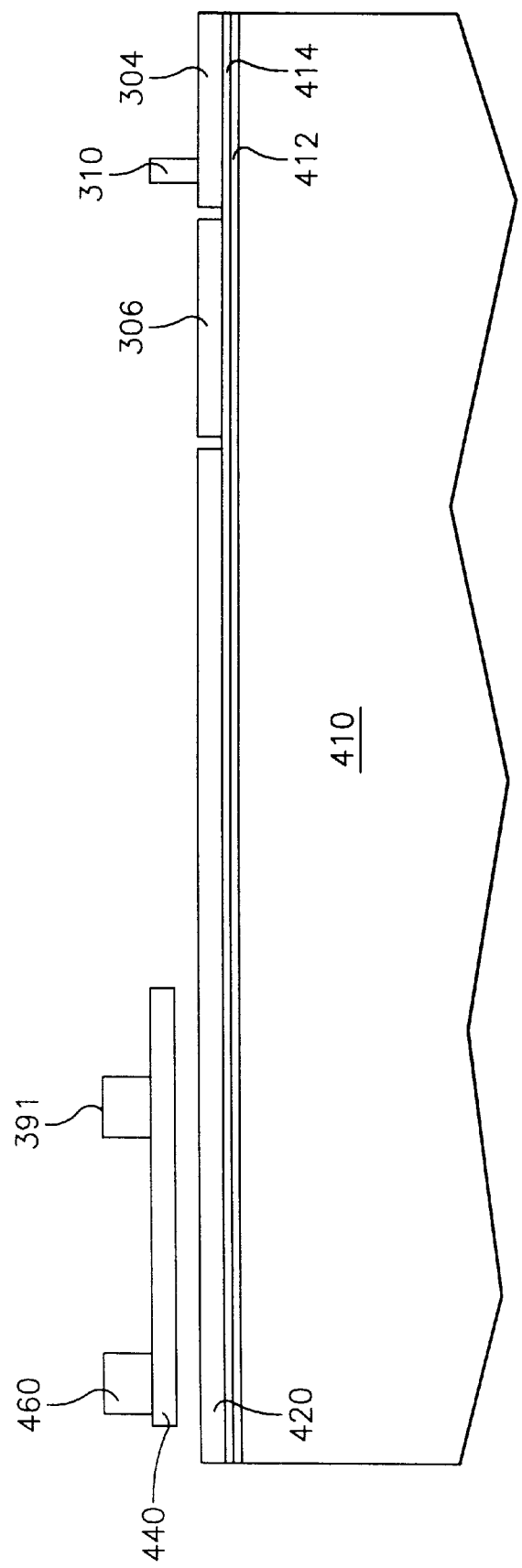
FIG. 8 is a side cross-section of layers of material in accordance with an embodiment of the present invention.

Next, an insulation layer is applied in the step of forming an insulation layer 514. This step is shown in FIG. 10a. Preferably, the insulation layer includes a silicon dioxide (SiO$_2$) layer 412 which is 0.63 $\mu$m thick. This SiO$_2$ layer 412 functions as an electrical insulator between the substrate 410 and the poly 0 layer 420. On top of the SiO$_2$ layer 412 is preferably deposited a 0.8 $\mu$m thick layer of low-stress silicon nitride$_x$(SiNx) layer 414. This layer acts as an etch stop to protect the SiO$_2$ layer 412 during etching. The process of applying both the SiO$_2$ layer 412 and the SiNx layer 414 are well known to one skilled in the art. These layers are shown in FIG. 8.

The next step is forming a poly 0 layer 516, as shown in FIG. 10a. The poly 0 layer 420 can be deposited by any method well known in the art. The poly 0 layer 420 is preferably a doped polycrystalline silicon (Si) 0.5 $\mu$m thick.

As FIGS. 7a and 10a show, the next step is etching the poly layer 518. This step can be performed by any of a variety of well known in the art photolithography and etching methods. For example, after applying an oxide mask, the poly 0 layer can be etched by a dry etching process such as reactive ion etching (RIE) It is preferred that the poly 0 layer 420 is etched to define the shield 304 and the actuator 306. The shield 304 and actuator 306 are separate from one another to allow different voltages to be applied to each. This allows the later applied actuator arm 330 may be raised and lower by attracting it to, or repelling it from, the actuator 306.

The next step is forming over the first structure a sacrificial layer with a via to the first structure 520. This step is shown in FIGS. 7b and 9. Although a variety of materials can be used for the sacrificial layer, it is preferred that an oxide is used. In some embodiments of the method, the step of forming over the first structure a sacrificial layer with a via to the first structure 520 includes the steps of forming a lower oxide layer 522 and etching the oxide layer 524, as shown in FIG. 10b.

After the poly 0 layer 420 has been etched, the step of forming a lower oxide layer 522 is performed. This step is shown in FIG. 10b. The oxide layer 430 is preferably a tetraethylorthosilicate or TEOS formed to a thickness of 2.0 µm. Application of an oxide layer, such as the lower oxide layer 430, can be done by any of a variety of processes well known in the art.

Figure 10B:
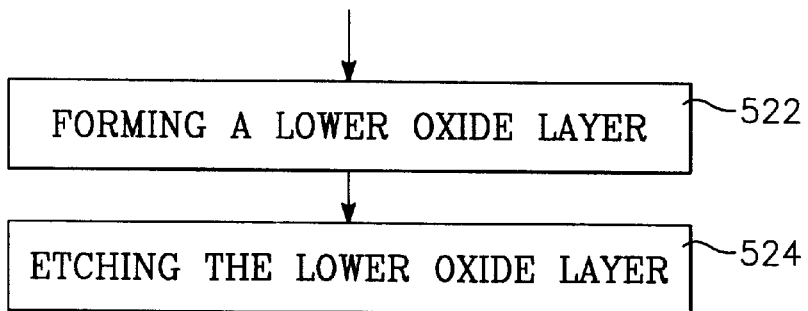

Then, the oxide layer 430 is etched in the step of etching the oxide layer 524, as shown in FIGS. 7b and 10b. During this step, the oxide layer is etched to open vias 432 through the oxide layer 430 to the Poly 0 layer 420. It is preferred that a photoresist mask is applied to define the vias for etching. The etching can be performed by any suitable method well known in the art. It is preferred, however, that the etching is a wet etch, where the wafer is immersed in a bath of hydrofluoric acid (HF) to remove the undesired portions of the oxide layer.

The vias 432 function to allow the connection of structures between the poly 1 layer 440 (not shown) and the poly 0 layer 420. Preferably, the later applied actuator hinge 310 is connected to through the vias 432 to the poly 0 layer 420.

The next step in some embodiments of method 500, is forming a hinge with an anchor attached through the via to the first structure and a first flexible member attached to the anchor 530. This step is shown in FIGS. 7c and 9. This step can be performed by any process well known in the art. Preferably, during this step hinge 310 is created. While a variety of materials can be used, it is preferred that the hinge 310 is a poly 1 material. In some embodiments, this step includes the steps of forming a poly 1 layer 532 and etching the poly 1 layer to define a hinge 534.

Figure 10C:
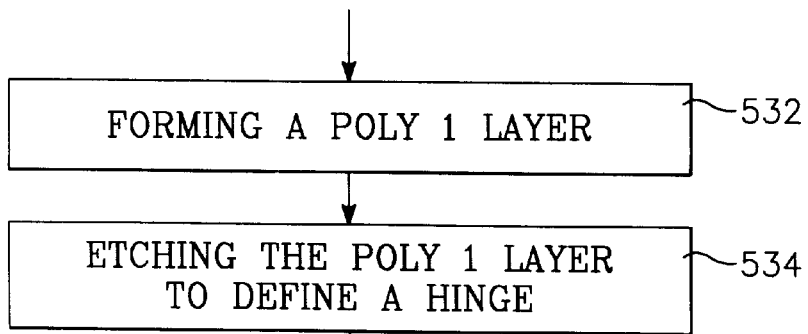

As shown in FIG. 10c, in the step of forming a poly 1 layer 532 ply 1 layer 440 is deposited. This layer can be deposited by any of a variety of methods well known in the art. Also, it is preferred that the poly 1 layer 440 is a doped polycrystalline silicon (Si) 1.0 µm thick. The poly 1 layer 440 is deposited over the vias 432 such that its material extends down through the vias 432 and connects with the poly 0 420 layer.

Then, the step of etching the poly 1 layer to define a hinge 534 is carried out. This step in shown in FIGS. 7c and 10c. Preferably the hinge 310 is etched from the poly 1 layer 440, defining the anchor points 312, the flexible members 314, the main arm connectors 316, the backflap connectors 318 and the central section 320. The hinge 310 is defined such that its anchor points 312 are positioned at, or about, the vias 432 (not shown). The anchor points 312 extend down and connect to the poly 0 layer 420. The etching of the poly 1 layer 440 can be performed by any suitable etching methods known in the art but the process of applying an oxide mask and dry etching is preferred. A preferable dry etching process is reactive ion etching (RIE). To define the elements in the poly 1 layer 440, the etching should at least pass through the poly 1 layer.

The next step of method 500 is forming a deflectable structure attached to the hinge at the first flexible member 540, as shown in FIGS. 7c and 9. While the deflectable structure can be attached in any of a variety of configurations, including applying another sacrificial layer to allow the deflectable structure to be mounted over the hinge (through vias in the sacrificial layer), it is preferred that the deflectable structure is simply etched out of the same layer as the hinge. Further, it is preferred that the deflectable structure is the actuator arm 330. Specifically, that the actuator arm hinge 310 is etched to be positioned between, and connected to the main arm portion 334 and the backflap 332.

It is also preferred that on the actuator arm 330 is etched the mirror hinge 350 and the mirror structure 360. Within the mirror structure 360 are etched the guides 360 and the catches 370. The catches 370 each including and upper trench 375 and a lower trench 377.

The etching of the poly 1 layer 440 can be performed by any suitable etching methods known in the art, but the process of applying an oxide mask and dry etching is preferred. A preferred dry etching process is reactive ion etching (RIE). To define the elements in the poly 1 layer 440, the etching should at least pass through the poly 1 layer.

The next step is removing the sacrificial layer so that the deflectable structure may rotate about the hinge 550. This step is shown in FIG. 9. With the sacrificial layer being an oxide, this step can be achieved by any acceptable method known in the art for removing oxide layers. Preferably, oxide layer is removed by immersing the wafer in a bath of hydrofluoric acid (HF) until the oxide is dissolved.

With the oxide layer removed, the actuator arm 330 will be connected to the surface 302 only at the hinge 310. This allows the actuator arm 330 to rotate about the hinge 310.

In other embodiments of the method of the present invention addition steps can be performed.

Some additional steps for the method 500 include further steps of the step of forming a deflectable structure attached to the hinge at the first flexible member 540. Specifically, the method 500 can also include the steps of forming a second sacrificial layer with a via to the deflectable structure 542 and forming latches attached to the deflectable structure 546. These steps are shown in FIG. 10d.

Figure 7D:
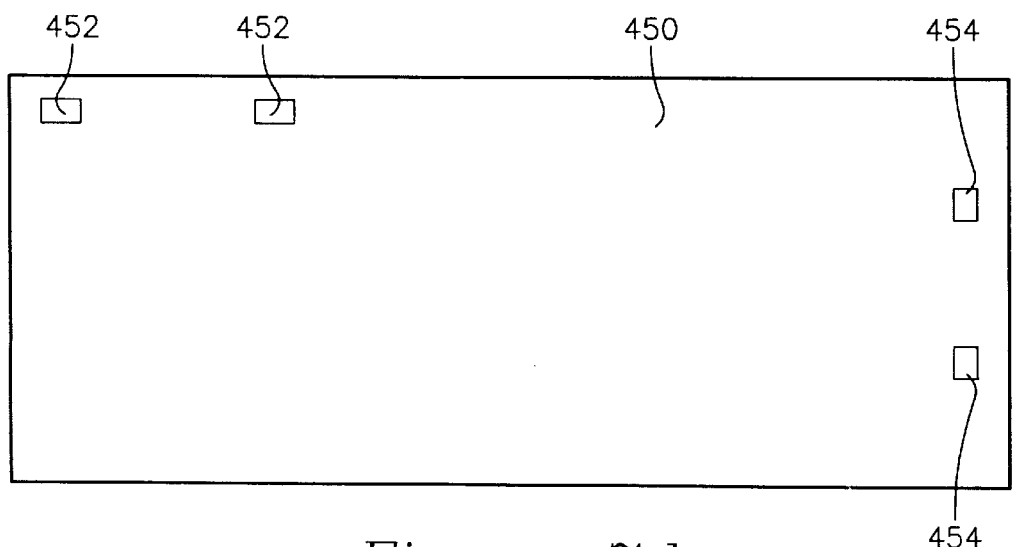
Figure 10D:
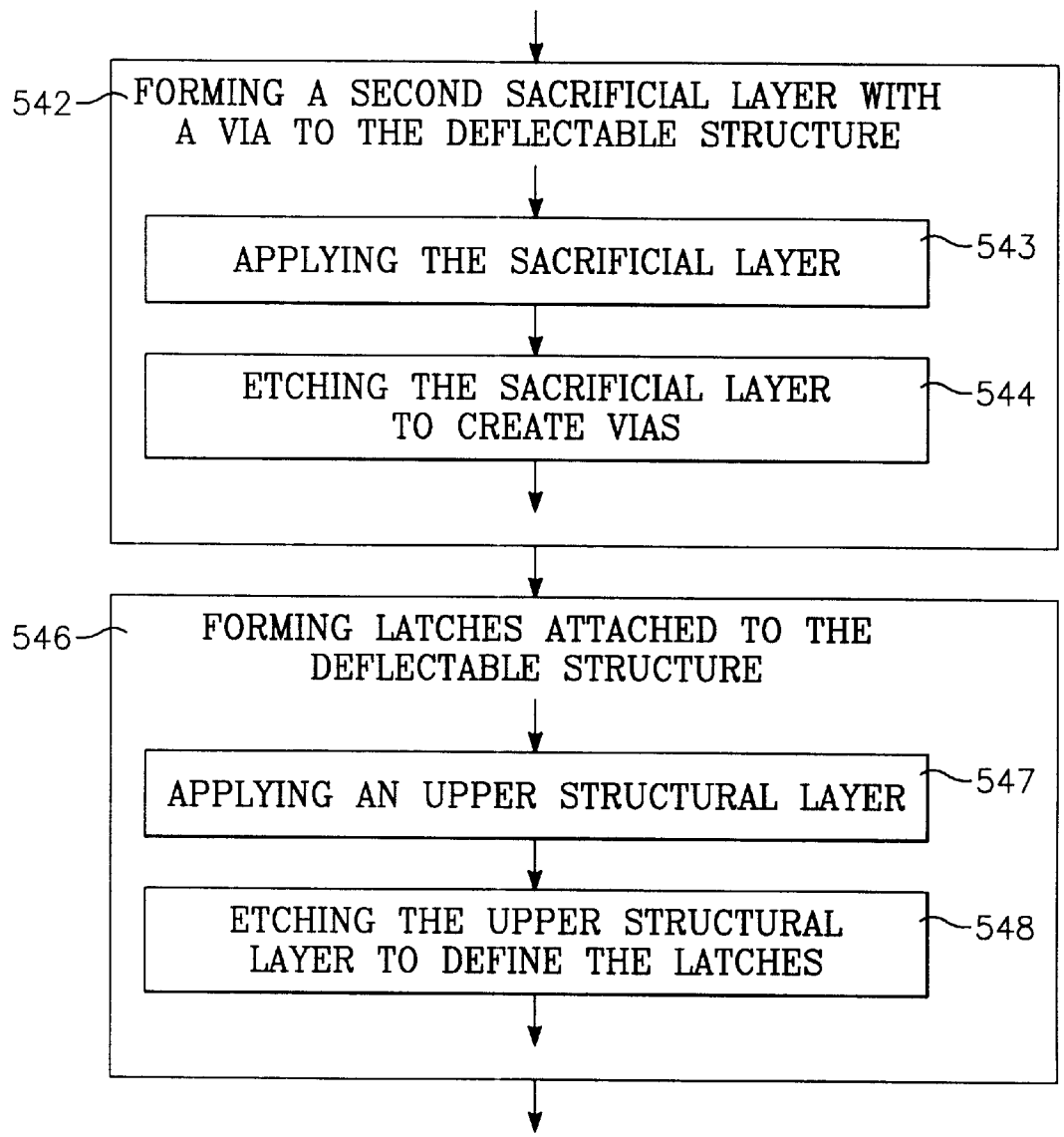

The step of forming a second sacrificial layer with a via to the deflectable structure 542 can include the steps of applying the sacrificial layer 543, etching the sacrificial layer to create vias 544, as shown in FIG. 10d. The deposition of the sacrificial layer can be accomplished with any known suitable deposition method. It is preferred that the sacrificial layer is oxide layer 450, which is either a tetraethylorthosilicate or TEOS, deposited to a thickness of 0.5 µm. As shown in FIG. 8. Also, preferably the etching creates vias 452 and 454, as shown in FIG. 7d. The vias 452 and 454 are etched through the oxide layer 450 to the actuator arm 330 (not shown) on the poly 1 layer 440 (not shown). As with the other oxide layer etching, the etching in this step can be performed by any suitable known etching method, preferably by a wet etch, with the wafer immersed in a bath of hydrofluoric acid (HF) to remove the undesired portions of the oxide layer.

Figure 7E:
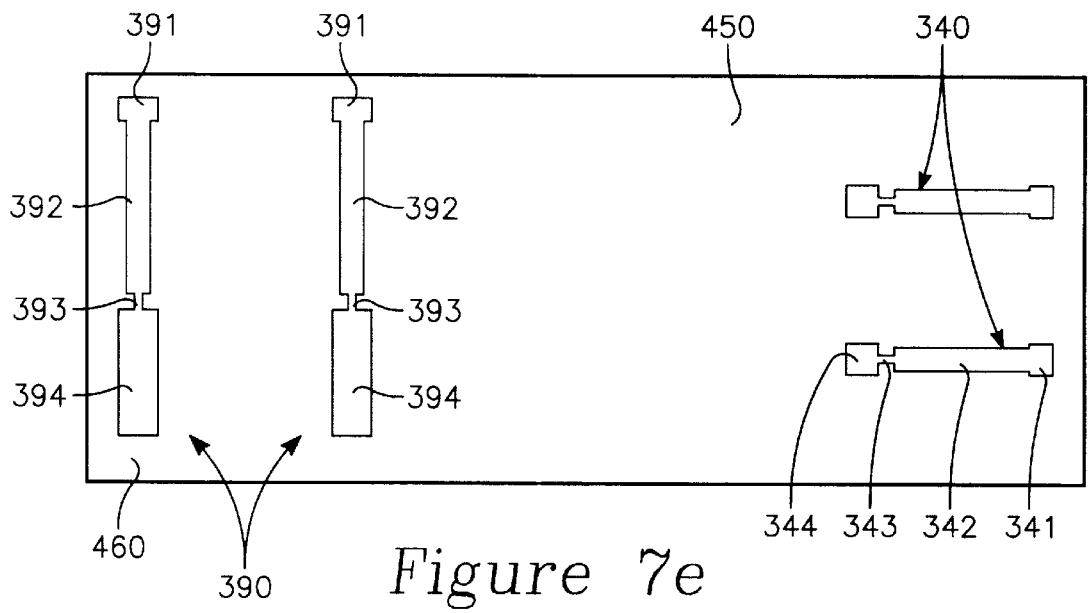
Figure 7F:
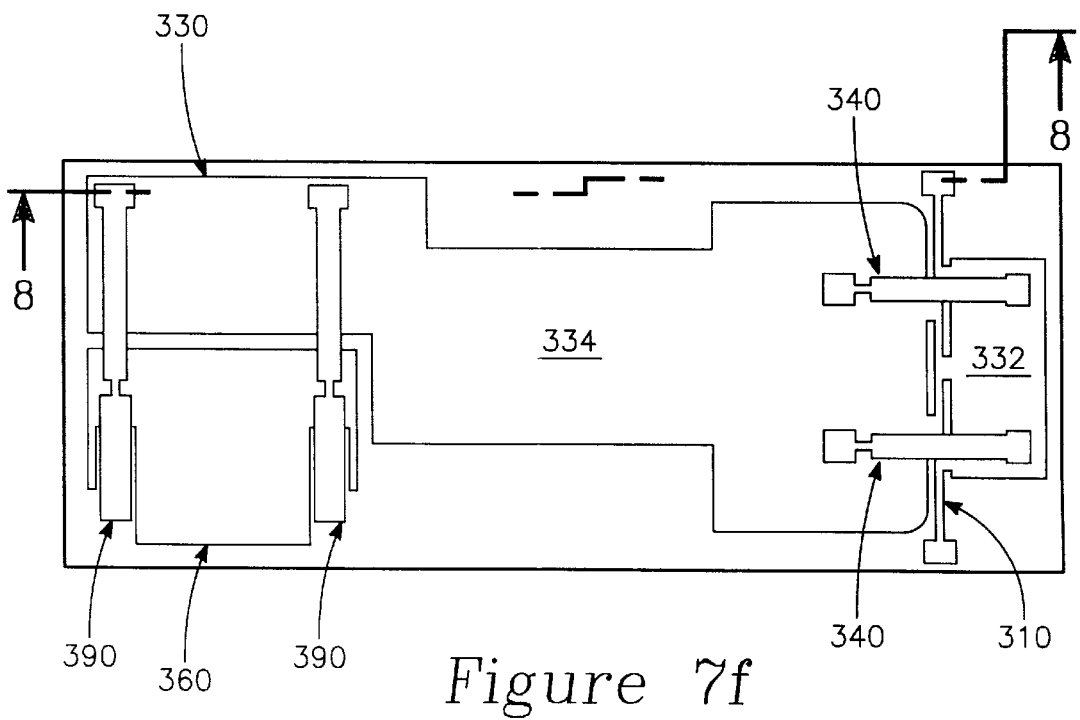

Then, the step of forming latches attached to the deflectable structure 546 is performed. This step includes applying an upper structural layer 547 and etching the upper structural layer to define the latches 548, as shown in FIG. 10d. It is preferred that the upper structural layer is the poly 2 layer 460 and that is applied over the middle oxide layer 450 and through the vias 452 and 454 to the actuator arm 330. As with the deposition of the other poly layers, the deposition of the poly 2 layer 460 can be performed by any acceptable well known method. Although the top poly layer can be deposited to any of a variety of thicknesses, it is preferred that the layer is deposited to a thickness of 1.5 µm. Also, the preferred material for the poly 2 layer 460 is a doped polycrystalline silicon (Si). Etching the upper structural layer is done to define both the actuator latches 340 and the mirror latches 390. As shown in FIG. 7e, the actuator latches are etched to each include the anchor 341, the inboard portion 342, the central portion 343 and the outboard portion 344. Likewise, the mirror latches 390 are etched so that they each have an anchor 391, an inboard portion 392, a central portion 393 and an outboard portion 394. Preferably, each anchor 341 is located above each via 454 (not shown) and each anchor 391 is positioned above each via 452 (not shown), so that the anchors of the latches are mounted to the actuator arm 330. This etching step can also be carried out by any suitable known photolithography and etching methods. As with the etching of the other poly layers, the preferred method here is applying an oxide mask and dry etching. Further the preferred dry etching process is reactive ion etching (RIE). During this etching step, the etching should be through the poly 2 layer 460 to the middle oxide layer 430.

Figure 10E:
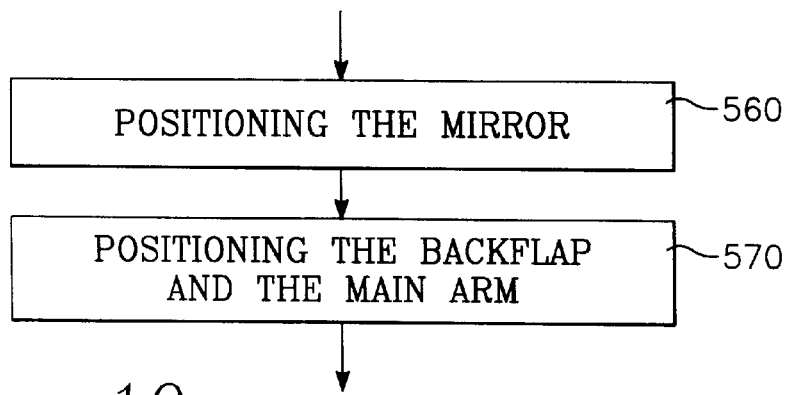

Another possible additional step is positioning the mirror 560 is performed, as shown in FIG. 10e. Preferably during this step the mirror structure 360 is raised by placing a probe under the mirror structure 360 and lifting the structure. As the mirror structure 360 is raised it rotates about the mirror hinge 350. As this occurs the latches 390 are first received by the catches 370 and then guided by the guides 366 over the catches 370. Specifically, the outboard portions 394 are received by the upper trenches 375. Then, as the mirror structure 360 is raised further, the catches 370 slide along underneath the outboard portions 394 until reaching the central portions 393. Then the central portions 393 each drop into their respective lower trenches 377, locking the latches in the catches. This secures the mirror structure in its upright position on the actuator arm 330.

Similarly, an additional step is positioning the backflap and the main arm 570. This step is shown in FIG. 10e. It is preferred that the main arm 334 is also raised up by a probe. During this step a probe is placed under the main arm 334 and it is raised until the actuator latches 340 lock into the arm 334, securing the backflap 332 to the main arm 334 in a fixed position. As the main arm 334 is raised by the probe and the backflap 332 is positioned on the surface 302, both the main arm 334 and the backflap 332 rotate about the hinge 310. While the flexible members 314 are deformed axially (twisted) to some extent, the angled structure of the raised main arm 334 and the backflap 332, is achieved with the bending of the main arm connectors 316 and backflap connectors 318.

In an alternate embodiment of the method 500, the switch is fabricated by using an oxide material (e.g. tetraethylorthosilicate or TEOS) in place of the polycrystalline silicon used in the poly 0 layer 420, the poly 1 layer 440 and the poly 2 layer 460. Likewise, the oxide layers are be replaced with a polycrystalline silicon material. In this embodiment, the poly layers are the sacrificial layers and the oxide layers are the structural layers of the fabricated switch. The poly layers are still etched by a dry etch, such as reactive ion etching (RIE) with oxide masks and the oxide layer are etched with a wet etch, such as a hydrofluoric acid (HF) bath, with photoresist masks.

In one other alternate embodiment, in place of the insulation layer 514 an additional oxide layer can be used.

While the preferred embodiments of the present invention have been described in detail above, many changes to these embodiments may be made without departing from the true scope and teachings of the present invention. The present invention, therefore, is limited only as claimed below and the equivalents thereof.

What is claimed is:

1. A thin film structure comprising:
    a first structure;
    a second structure;
    a hinge coupled between the first structure and the second structure, wherein the hinge has a first flexible member aligned substantially along an single axis, wherein the second structure can rotate relative to the first structure substantially about the axis;
    wherein the hinge further comprises a second flexible member aligned substantially along the axis;
    wherein the first flexible member and the second flexible member are positioned on opposite sides of the second structure;
    wherein the hinge further comprises a central section positioned between the first flexible member and second flexible member and connected to the second structure;
    wherein the first flexible member and the second flexible member are both deformable about the axis;
    wherein the first flexible member and the second flexible member both deform about the axis as the second structure is rotated;
    wherein the first flexible member and the second flexible member are elongated;
    wherein the hinge further comprises a first anchor mounted between the first structure and the first flexible member and a second anchor mounted between the first structure and the second flexible member, so that the first anchor and the second anchor couple the hinge to the first structure;
    wherein the first anchor extends away from the first structure to the first flexible member, so that an opening is defined between the first flexible member and the first structure, and wherein the second anchor extends away from the first structure to the second flexible member, so that an opening is defined between the second flexible member and the first structure;
    wherein the first and second flexible members exert a biasing force on the second structure to urge the second structure towards the first structure; and
    wherein the hinge further comprises a tab connecting the central section to the second structure, so that the tab couples the hinge to the second structure.

2. The thin film structure of claim 1, wherein the central section is an elongated member substantially aligned with the axis.

3. The thin film structure of claim 2, wherein the second structure is a mirror structure.

4. The thin film structure of claim 3, wherein the first structure is an actuator arm.

5. The thin film structure of claim 2, wherein the second structure is a latch.

6. The thin film structure of claim 2, wherein the first structure is an actuator arm.

7. The thin film structure of claim 6, wherein the first structure is a main arm.

8. The thin film structure of claim 6, wherein the first structure is a backflap.

9. The thin film structure of claim 2, wherein the second structure is an actuator arm.

10. The thin film structure of claim 9, wherein the first structure is a substrate.

11. The thin film structure of claim 10, where in the actuator arm has a mirror for reflecting a light beam.

12. The thin film structure of claim 10, wherein the actuator arm comprises a main arm, a backflap, and a mirror structure, wherein the mirror is mounted on the mirror structure.

13. The thin film structure of claim 9, wherein the actuator arm is comprised of a polycrystalline silicon.

14. The thin film structure of claim 13, wherein the actuator arm is about 1.0 $\mu$m thick.

15. The thin film structure of claim 9, wherein the first structure is comprised of polycrystalline silicon.

16. The thin film structure of claim 15, wherein the first structure is about 0.5 μm thick.

17. The thin film structure of claim 1, wherein the hinge is comprised of polycrystalline silicon.

18. The thin film structure of claim 17, wherein the hinge is about 1.0 μm thick.

19. A MEMS optical switch comprising:
a substrate surface;
an actuator arm having a mirror; and
a hinge mounted between the substrate surface and the actuator arm so that the actuator arm can rotate relative to the substrate surface, wherein the hinge comprises:
central section, wherein the central section is mounted to the actuator arm;
a first flexible member;
a second flexible member, wherein the first flexible member and the second flexible members are connected to opposing sides of the central section substantially along an axis;
a first anchor, wherein the first anchor is mounted between the first flexible member and the substrate surface; and
a second anchor, wherein the second anchor is mounted between the second flexible member and the substrate surface;
wherein the first flexible member and the second flexible member both deform about the axis as the actuator arm is rotated;
wherein the first flexible member and the second flexible member are elongated beams;
wherein the first anchor extends away from the substrate surface to the first flexible member, so that an opening is defined between the first flexible member and the substrate surface, and wherein the second anchor extends away from the substrate surface to the second flexible member, so that an opening is defined between the second flexible member and the substrate surface;
wherein the opening extends under the central section;
wherein the first and second flexible members exert a biasing force on the actuator arm to urge the actuator arm towards the substrate surface;
wherein the hinge further comprises a tab connecting the central section to the actuator arm.

20. The MEMS optical switch of claim 19, wherein the actuator arm comprises a backflap and a main arm, wherein the backflap and the main arm are disposed on opposing sides of the hinge, lateral to the axis.

21. The MEMS optical switch of claim 20, wherein the hinge further comprises a main arm connector positioned between the central section and the main arm and a backflap connector positioned between the backflap and the central section.

22. The MEMS optical switch of claim 21, wherein the main arm connector comprises two tabs and wherein the backflap connector comprises two tabs.

23. The MEMS optical switch of claim 22, wherein the central section is an elongated member substantially aligned with the axis.

24. The MEMS optical switch of claim 23, wherein the hinge is comprised of a polycrystalline silicon.

25. The MEMS optical switch of claim 24, wherein the hinge is about 1.0 μm thick.

26. The MEMS optical switch of claim 25, wherein the actuator arm is comprised of a polycrystalline silicon.

27. The MEMS optical switch of claim 26, wherein the actuator arm is about 1.0 μm thick.

28. The MEMS optical switch of claim 27, wherein the substrate surface comprised of a polycrystalline silicon.

29. The MEMS optical switch of claim 28, wherein the substrate surface is about 0.5 μm thick.

30. A thin film structure comprising:
a first structure;
a second structure; and
a hinge coupled between the first structure and the second structure, wherein the hinge comprises a first flexible member;
a center section coupled to the first flexible member;
a second flexible member coupled to the center section, the first flexible member, second flexible member and center portion aligned substantially along a single axis; and
a tab connecting the second structure to the center section.

31. A MEMS optical switch comprising:
a. a substrate surface;
b. an actuator arm having a mirror; and
c. a hinge mounted between the substrate surface and the actuator arm so that the actuator arm can rotate relative to the substrate surface, wherein the hinge comprises:
(i) a central section, wherein the central section is mounted to the actuator arm via a tab;
(ii) a first flexible member;
(iii) a second flexible member, wherein the first flexible member and the second flexible members are connected to opposing sides of the central section substantially along an axis;
(iv) a first anchor, wherein the first anchor is mounted between the first flexible member and the substrate surface; and
(v) a second anchor, wherein the second anchor is mounted between the second flexible member and the substrate surface.

* * * * *